United States Patent
Hormis et al.

(10) Patent No.: US 9,300,444 B2
(45) Date of Patent: Mar. 29, 2016

(54) WIDEBAND QUADRATURE ERROR CORRECTION

(71) Applicant: ANALOG DEVICES, INC, Norwood, MA (US)

(72) Inventors: Raju Hormis, New York, NY (US); Steven R. Bal, Cary, NC (US); Kevin Glenn Gard, Raleigh, NC (US); Jianxun Fan, Apex, NC (US); David J. McLaurin, Durham, NC (US); Antonio Montalvo, Raleigh, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 13/951,341

(22) Filed: Jul. 25, 2013

(65) Prior Publication Data

US 2015/0030102 A1    Jan. 29, 2015

(51) Int. Cl.

| | |
|---|---|
| H04L 1/24 | (2006.01) |
| H04L 27/36 | (2006.01) |
| H04B 17/21 | (2015.01) |
| H03F 3/24 | (2006.01) |
| H03F 3/45 | (2006.01) |
| H04B 17/14 | (2015.01) |
| H04B 17/17 | (2015.01) |
| H04B 17/18 | (2015.01) |

(52) U.S. Cl.
CPC ............... *H04L 1/243* (2013.01); *H03F 3/245* (2013.01); *H03F 3/45475* (2013.01); *H04B 17/14* (2015.01); *H04B 17/17* (2015.01); *H04B 17/18* (2015.01); *H04B 17/21* (2015.01); *H04L 27/364* (2013.01); *H04L 27/366* (2013.01); *H03F 2200/336* (2013.01); *H03F 2203/45512* (2013.01)

(58) Field of Classification Search
USPC .................. 375/296, 298, 346, 297, 324, 254
See application file for complete search history.

(56) References Cited

U.S. PATENT DOCUMENTS

| | | | |
|---|---|---|---|
| 5,293,406 | A | 3/1994 | Suzuki |
| 5,705,949 | A | 1/1998 | Alelyunas et al. |

(Continued)

FOREIGN PATENT DOCUMENTS

| | | |
|---|---|---|
| EP | 2367332 | 9/2011 |
| RU | 2011123470 | 1/2013 |
| WO | WO 2014/145350 | 9/2014 |

OTHER PUBLICATIONS

Extended European Search Report received in European Patent Application No. 14177874.6, dated Jan. 29, 2015; in 7 pages.

(Continued)

*Primary Examiner* — Kabir A Timory
(74) *Attorney, Agent, or Firm* — Knobbe, Martens, Olson & Bear LLP

(57) ABSTRACT

A transmission module is provided that includes a transmitter, a loopback receiver, and a QEC controller. In a first state, the QEC controller calibrates the loopback receiver to remove quadrature imbalance in the loopback receiver. In a second state, a communication pathway is provided between the transmitter and the loopback receiver, and the QEC controller identifies quadrature imbalance in the transmitter based at least one a comparison of the data signals at the output of the loopback receiver with data signals at the input of the transmitter. Based on the comparison, the QEC controller can adjust one or more characteristics of the transmitter to correct quadrature errors in the transmitter.

19 Claims, 7 Drawing Sheets

(56) References Cited

U.S. PATENT DOCUMENTS

| | | |
|---|---|---|
| 7,894,555 B2 | 2/2011 | Lindoff et al. |
| 7,944,984 B1 * | 5/2011 | Wu et al. .................. 375/261 |
| 8,036,317 B2 | 10/2011 | D'Alessandro |
| 8,290,450 B2 | 10/2012 | Hammerschmidt et al. |
| 8,331,506 B2 | 12/2012 | Park et al. |
| 8,509,298 B2 | 8/2013 | Hormis |
| 2001/0022532 A1 | 9/2001 | Dolman |
| 2004/0092241 A1 * | 5/2004 | Kim et al. .................. 455/255 |
| 2005/0069050 A1 | 3/2005 | Ding et al. |
| 2005/0260949 A1 * | 11/2005 | Kiss et al. .................. 455/67.14 |
| 2006/0062324 A1 | 3/2006 | Masashi et al. |
| 2006/0121858 A1 * | 6/2006 | Tanaka et al. .................. 455/91 |
| 2006/0215783 A1 * | 9/2006 | Shako et al. .................. 375/296 |
| 2007/0211822 A1 | 9/2007 | Olesen et al. |
| 2007/0263745 A1 | 11/2007 | Hayase et al. |
| 2007/0286307 A1 | 12/2007 | Hayashi et al. |
| 2008/0195920 A1 | 8/2008 | Luce et al. |
| 2009/0224828 A1 | 9/2009 | Hideharu et al. |
| 2010/0119012 A1 | 5/2010 | Pal |
| 2010/0316163 A1 | 12/2010 | Forenza et al. |
| 2011/0013724 A1 | 1/2011 | Metreaud et al. |
| 2011/0075715 A1 | 3/2011 | Kravitz |
| 2012/0087451 A1 | 4/2012 | Razzell |
| 2012/0314784 A1 | 12/2012 | Pratt et al. |
| 2014/0154997 A1 | 6/2014 | Chen et al. |
| 2014/0270001 A1 | 9/2014 | Schubert et al. |
| 2014/0270002 A1 | 9/2014 | Schubert et al. |
| 2014/0273902 A1 | 9/2014 | An et al. |
| 2015/0030103 A1 | 1/2015 | Hormis et al. |

OTHER PUBLICATIONS

International Search Report and Written Opinion received in PCT Application No. PCT/US2014/030091, dated Jul. 10, 2014, 6 pages.

Narasimhan et al., "Digital Compensation of Tx/Rx I/Q Imbalance in TD-SCDMA Systems," Global Telecommunication Conference (Globecom) 2011, IEEE, Dec. 5, 2011, pp. 1-5.

* cited by examiner

WIDEBAND QUADRATURE ERROR CORRECTION

BACKGROUND

1. Field

Embodiments of the disclosure relate to electronic devices, and more particularly, in one or more embodiments, to wireless transmitters.

2. Description of the Related Technology

Transmitters for wireless infrastructure (e.g., cellular basestations) have traditionally been implemented using super-heterodyne or complex intermediate frequency (IF) architectures. Implementing a wireless transmitter (TX) using a direct conversion architecture instead of a super-heterodyne architecture can reduce overall system cost and size through integration and the use of fewer components. However, several issues can arise with the use of direct conversion wireless transmitters.

Direct conversion transmitters (TX) include an in-phase (I) and quadrature phase (Q) baseband path, each driving a mixer also driven by a local oscillator (LO) signal having a frequency about equal to the desired radio frequency (RF) center frequency. The I-path mixer LO signal and Q-path mixer LO signal are 90 degrees out of phase (sine and cosine), and the mixer outputs are summed at RF. Any mismatch in the amplitude of the I or Q path (amplitude error), or any deviation of the phase difference of the two paths from 90 degrees (phase error) is referred to collectively as quadrature error or a quadrature imbalance. Quadrature errors can result in an undesired sideband (USB), in which a desired signal at some frequency offset from the carrier will have an undesired image at the negative of that offset frequency. This image is considered an undesired emission, and acceptable levels of undesired emissions are determined by various wireless standards.

In some instances, for multi-carrier (MC) basestation applications, a direct conversion TX is required to have very low undesired sideband levels (e.g., less than −75 dBm/Hz), which can be achieved through a calibration process called quadrature error correction (QEC).

Some QEC processes observe the transmit signal alone (blind algorithms) and assume zero correlation between the I and Q TX signals when the undesired sideband has been eliminated. However, digital pre-distortion (DPD), which is used in basestations to improve power amplifier (PA) efficiency, can create correlation between the I and Q TX signals. Thus, for blind QEC processes, the DPD-related correlation can be falsely detected as a quadrature error, and limit the minimum achievable undesired sideband.

To further complicate QEC, quadrature errors in the transmitter can vary with baseband frequency due to baseband filter mismatch, DAC clock skew, etc. In addition, placing the transmitter offline to complete the calibration process is undesirable as it can lead to dropped calls and other undesirable side effects.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description" one will understand how the features of this invention provide advantages that include quadrature error correction of data signals.

In some embodiments, a transmission module is provided that includes a switching module, a transmitter communicatively coupled to the switching module, a loopback receiver communicatively coupled to the switching module, a calibration module communicatively coupled to the switching module, and a controller communicatively coupled to the loopback receiver. In certain embodiments, in a first state, the switching module is configured to provide a communication pathway between an output of the calibration module and an input of the loopback receiver, and the controller is configured to identify and correct quadrature imbalance in the loopback receiver based at least on a comparison of the output of the loopback receiver with an expected output. Furthermore, in some embodiments, in a second state, the switching module is configured to provide a communication pathway between an output of the transmitter and an input of the loopback receiver. In addition, in the second state, the controller is configured to identify quadrature imbalance in the transmitter based at least partly on a comparison of a data signal received from the loopback receiver with a buffered data signal that corresponds to a data signal received by the transmitter, and adjust one or more characteristics of the transmitter to correct the identified quadrature imbalance present in the transmitter based at least partly on the comparison.

In some embodiments, a transmission module is provided that includes a transmitter a loopback receiver and a controller. The controller can be configured to calibrate the loopback receiver to account for quadrature imbalance in the loopback receiver, receive a data signal from the calibrated loopback receiver that corresponds to a data signal received by the transmitter, identify quadrature imbalance in the transmitter based at least partly on a comparison of the data signal received from the calibrated loopback receiver with a buffered data signal that corresponds to the data signal received by the transmitter, and adjust one or more characteristics of the transmitter to correct the identified quadrature imbalance based at least partly on the comparison.

In certain embodiments, the aforementioned transmission module can further include a switching module communicatively coupled between an output of a calibration module, an input of the loopback receiver and an output of the transmitter. Furthermore in a first state, the switching module can be configured to provide a communication pathway between the output of the calibration module and the input of the loopback receiver. In addition, in certain embodiments, in a second state, the switching module can be configured to provide a communication pathway between the output of the transmitter and the input of the loopback receiver. In some embodiments, during calibration of the loopback receiver, the switching module is configured to operate in the first state.

In some embodiments, a method is provided that includes calibrating a loopback receiver to account for quadrature imbalance in the loopback receiver, receiving, from the calibrated loopback receiver, a data signal that has been processed by the calibrated loopback receiver and that corresponds to a data signal received by a transmitter communicatively coupled with the loopback receiver, identifying quadrature imbalance in the transmitter based at least partly on a comparison of the data signal received from the calibrated loopback receiver with a buffered data signal that corresponds to the data signal received by the transmitter, and adjusting one or more characteristics of the transmitter to correct the identified quadrature imbalance based at least partly on the comparison.

In certain embodiments, the calibrating the loopback receiver can include providing a communication pathway between an output of a calibration module and an input of the loopback receiver, processing a data signal received from the calibration module using the loopback receiver, identifying quadrature imbalance in the loopback receiver based at least partly on a comparison of the processed data signal with an expected output of the loopback receiver, and adjusting one or more characteristics of the loopback receiver based at least partly on the identified quadrature imbalance in the loopback receiver.

DETAILED DESCRIPTION

Figure 1:
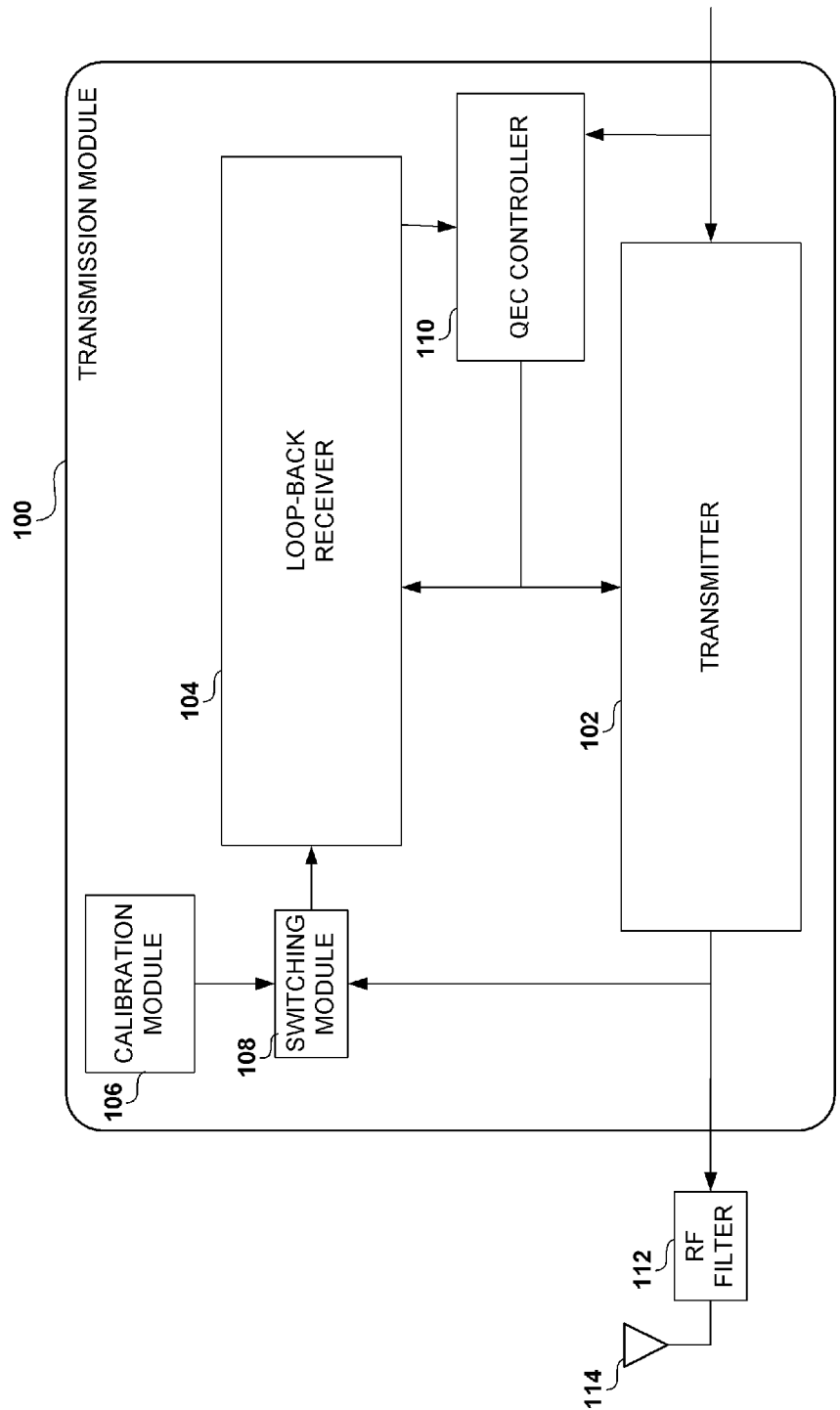
FIG. 1 is a block diagram of an embodiment of a transmission module.

The following detailed description of certain embodiments presents various descriptions of specific embodiments of the disclosure. However, the other embodiments of the disclosure can be implemented in a multitude of different ways as defined and covered by the claims. In this description, reference is made to the drawings where like reference numerals indicate similar elements.

As described herein, a transmission module is provided that includes a transmitter, a loopback receiver, a calibration module, a switching module, and a QEC controller. The switching module can be located between the transmitter output, calibration module output, and the loopback receiver input. During a calibration mode, the switching module provides a communication pathway between the calibration module and the loopback receiver. The loopback receiver processes data signals received from the calibration module and outputs the processed data signals to the QEC controller. Using the processed data signals received from the loopback receiver, the QEC controller calibrates the loopback receiver to remove quadrature imbalance in the loopback receiver, as described in greater detail in U.S. Prov. App. No. 61/786,393 filed Mar. 15, 2013 and 61/786,469 filed Mar. 15, 2013, and U.S. application Ser. No. 13/897,719 filed May 20, 2013, each of which is hereby incorporated herein by reference in its entirety.

After the quadrature errors have been reduced or removed from the loopback receiver, the transmission module can enter a QEC mode. During the QEC mode, the switching module provides a communication pathway between the output of the transmitter and the input of the loopback receiver. The loopback receiver processes data signals received from the transmitter and outputs the processed data signals to the QEC controller. The QEC controller compares the signals at the output of the loopback receiver with the signals at the input of the transmitter to identify and remove quadrature errors in the transmitter, as described in greater detail below and in U.S. Prov. App. No. 61/858,534, entitled WIDEBAND QUADRATURE ERROR DETECTION AND CORRECTION, filed Jul. 25, 2013, hereby incorporated by reference herein in its entirety.

FIG. 1 is a block diagram of an embodiment of a transmission module 100 configured to correct wideband quadrature errors in a direct conversion wireless transmitter using a narrowband observation. In the illustrated embodiment, the transmission module 100 includes a transmitter 102, a loopback receiver 104, a QEC controller 110, a calibration module 106, and a switching module 108. FIG. 1 further includes a radio frequency (RF) filter 112 (e.g., balun) and an antenna 114 in communication with the transmission module 100. In some embodiments, the RF filter 112 and antenna 114 form part of the transmission module 100. In certain embodiments, the RF filter 112 and antenna 114 do not form part of the transmission module 100.

The various components of the transmission module 100 can be communicatively coupled together either directly or indirectly. For example, in some embodiments, a first input of the QEC controller 110 can be communicatively coupled to the input of the transmitter 102. In addition, a second input of the QEC controller 110 can be communicatively coupled to the output of the loopback receiver 104. The output of the QEC controller 110 can be communicatively coupled to inputs of the transmitter 102 and the loopback receiver 104.

The output of the transmitter 102 can be communicatively coupled to the input of the RF filter 112, and the output of the RF filter 112 can be communicatively coupled to the antenna 114. The inputs of the switching module 108 can be communicatively coupled to the output of the transmitter 102 and the output of the calibration module 106. The output of the switching module can be communicatively coupled with the input of the loopback receiver 104.

The transmitter 102 can be configured to receive and process data signals for wireless transmission. In some embodiments, the data signals include an in-phase data signal and a quadrature data signal. After processing the data signals, the transmitter 102 sends the processed data signals to the RF filter 112 and the antenna 114 for wireless transmission. During the QEC mode, the processed data signals from the transmitter 102 can also be sent to the loopback receiver 104.

The transmitter 102 can include various components, which will be described in greater detail below with reference to FIG. 3, to process the data signals. The components can include, but are not limited to, filters (e.g., digital filters, analog filters, complex filters (single tap, two tap, etc.)), interpolators, digital to analog converters (DAC), mixers, local oscillators (LO), LO delay tuners, operational amplifiers, capacitors, resistors, transistors, etc. As will be described in greater detail below, the transmitter 102 can exhibit quadrature imbalance due to the various components of the transmitter 102 that introduce quadrature errors into the data signals.

The loopback receiver 104 can be configured to receive and process data signals received from the transmitter 102 or the calibration module 106, as will be described in greater detail below with reference to the switching module 108. After processing the data signals, the loopback receiver 104 sends the processed data signals to the QEC controller 110.

In some embodiments, the loopback receiver 104 can function similar to, and include components similar to those found in, a receiver that would receive the wireless transmissions from the antenna 114. For example, the loopback receiver can include, but is not limited to, filters (e.g., digital filters, analog filters, complex filters), decimators, analog to digital converters (ADC), mixers, local oscillators (LO) operational amplifiers, capacitors, resistors, transistors, etc., which will be described in greater detail below with reference to FIG. 3. In some embodiments, when in the QEC mode and when quadrature imbalance has been removed from the loopback receiver 104 and the transmitter 102, the data signals at the output of the loopback receiver 104 match the data signals at the input of the transmitter 102.

The calibration module 106 can output a data signal that is used by the loopback receiver 104 during the calibration mode and can be implemented as a phase locked-loop (PLL), an auxiliary transmitter, and the like. In one embodiment, the data signal has a pattern that has a known characteristic. For example, the calibration module 106 can output a training signal, which, in some embodiments, can be a single sideband signal (e.g., no signal present at the image frequency) or a double sideband signal. In some embodiments, the frequency of the data signal from the calibration module 106 can be stepped across the transmit band of the transmitter 102. The QEC controller 110 can use the data signals received at the different frequencies to identify and correct the quadrature imbalance of the loopback receiver 104 across the different frequencies. For example, knowing the characteristics of the training signal, the QEC controller 110 can determine that quadrature errors calculated by the QEC controller during the calibration mode are due to the loopback receiver 104, and correct them.

The switching module 108 can be implemented using one or more buffers, switches (e.g., transistors), and/or one or more filters, and can be used to determine which data signals are received by the loopback receiver 104. The buffers can include an enable/disable input. When the buffers are disabled, their output can be high impedance. When the buffers are enabled, they can output a buffered version of the signal at their inputs.

In the illustrated embodiment, the switching module 108 can receive data signals from the transmitter 102 and the calibration module 106. Accordingly, the switching module 108 can output data from different sources depending on its state, or mode. In a first state, or in the calibration mode, the switching module 108 can generate as an output, the data signals received from the calibration module 106. In a second state, or in the QEC mode, the switching module 108 can generate as an output, the data signals received from the transmitter 102. Accordingly, when the switching module 108 is in the calibration mode, the loopback receiver 104 processes the data signals received from the calibration module 106, and when the switching module 108 is in the QEC mode, the loopback receiver 104 processes the data signals received from the transmitter 102.

The QEC controller 110 can be implemented using one or more processors, microcontrollers, programmable logic devices (PLD), field-programmable gate arrays (FPGA), etc., and can be configured to receive processed data signals from the loopback receiver 104 and compare the processed signals with other data signals. Based on the comparison, the QEC controller 110 can adjust the characteristics of, or calibrate, the loopback receiver 104 and/or the transmitter 102.

The processed data signals received from the loopback receiver 104 can be compared with different signals depending on the mode of the transmission module 100. For example, during the calibration mode, the processed data signals from the loopback receiver 104 can be compared with signals received from the calibration module 106. In one embodiment, the signals from the calibration module 106 have a known characteristic. During the QEC mode, the processed data signals from the loopback receiver 104 can be compared with data signals received by the transmitter 102.

During the calibration mode, in some embodiments, the QEC controller 110 can compare the processed data signals from the loopback receiver 104 with data signals that are known, or stored, by the QEC controller 110. In some cases, the known signals represent an expected output of the loopback receiver 104. For example, the expected signals can be the signals outputted by the loopback receiver 104 when the loopback receiver has relatively little, or no, quadrature imbalance (i.e., introduces little, or no, quadrature error into the data signals received from the calibration module 106).

Based on the comparison, the QEC controller 110 can identify quadrature errors in the loopback receiver 104 and adjust one or more characteristics of the loopback receiver 104 to correct the quadrature errors. For example, the QEC controller 110 can adjust one or more filters in the in-phase or quadrature-phase paths of the loopback receiver 104, one or more LO delays in the in-phase or quadrature-phase LO paths, etc., as will be discussed in greater detail below. As previously mentioned, the data signal received by the loopback receiver 104 from the calibration module 106 can be stepped across the different frequencies of the transmit band. Accordingly, the quadrature imbalance of the loopback receiver 104 can be corrected across the transmit band.

During the QEC mode, in some embodiments, the QEC controller 110 can compare the processed data signals received from the loopback receiver 104 with the data signals that are received by the transmitter 102. In some embodiments, the data signals received by the transmitter 102 that are used by the QEC controller 110 for the comparison correspond to data signals that have already been processed by the transmitter 102 and/or been wirelessly transmitted by the antenna 114. Accordingly, these data signals can be buffered by the QEC controller 110 until they are compared with the output of the loopback receiver 104.

In certain embodiments, the QEC mode is entered after the QEC controller 110 has calibrated the loopback receiver 104. Accordingly, the QEC controller 110 can determine that differences between the data signals received from the loopback receiver 104 and the data signals received from the input of the transmitter are due to quadrature imbalance within the transmitter 102. Based on the determined quadrature imbalance in the transmitter 102, the QEC controller 110 can adjust one or more characteristics of the transmitter 102 to correct the quadrature imbalance. For example, the QEC controller 110 can adjust one or more filters (e.g., digital and/or analog filters) in the in-phase and/or quadrature-phase paths of the transmitter 102, one or more LO delays in the in-phase or quadrature-phase LO paths, etc.

Figure 2:
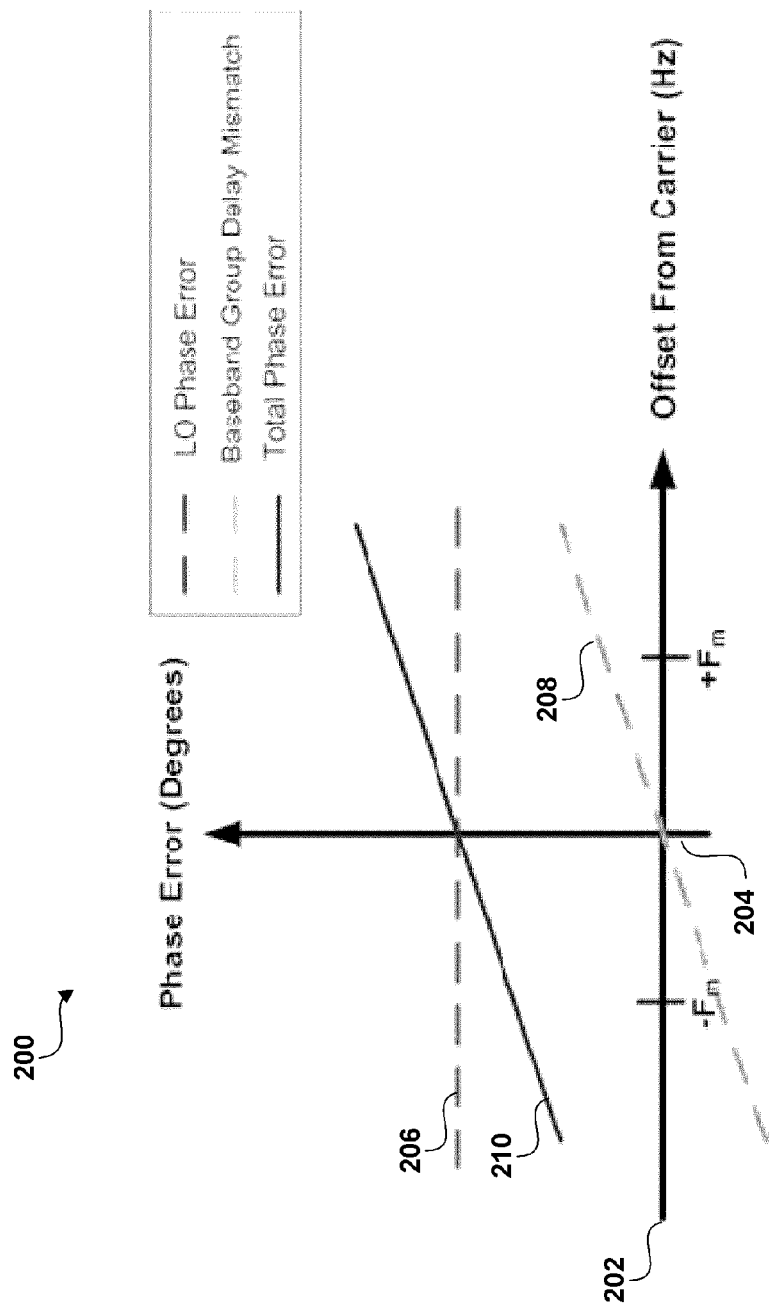
FIG. 2 is a plot of different types of phase errors that can be present in the transmitter and/or loopback receiver.

FIG. 2 is a plot 200 of different types of phase errors that can be present in the transmitter 102 and/or loopback receiver 104. The x-axis 202 of the plot represents a signal frequency, with the axis being centered at the carrier, or LO, frequency. The y-axis 204 of the plot 200 represents the amount of phase error. In some embodiments, the phase error can be caused by an LO phase error, a baseband group delay mismatch, and/or DAC clock skew. As is illustrated in FIG. 2, the phase error due to LO phase error 206 is typically relatively constant across the frequency spectrum, while phase error due to baseband group delay mismatch and/or DAC clock skew 208 can vary across the frequency spectrum. In the illustrated embodiment, the slope of the phase error due to baseband group delay mismatch and/or DAC clock skew is relatively constant. However, it will be understood, that in some instances the slope of the phase error due to baseband group delay mismatch and/or DAC clock skew can vary (e.g., can be second order). The total phase error 210 represents the summation of the phase error due to LO phase error 206, the phase error due to baseband group delay mismatch and/or DAC clock skew 208.

Figure 3:
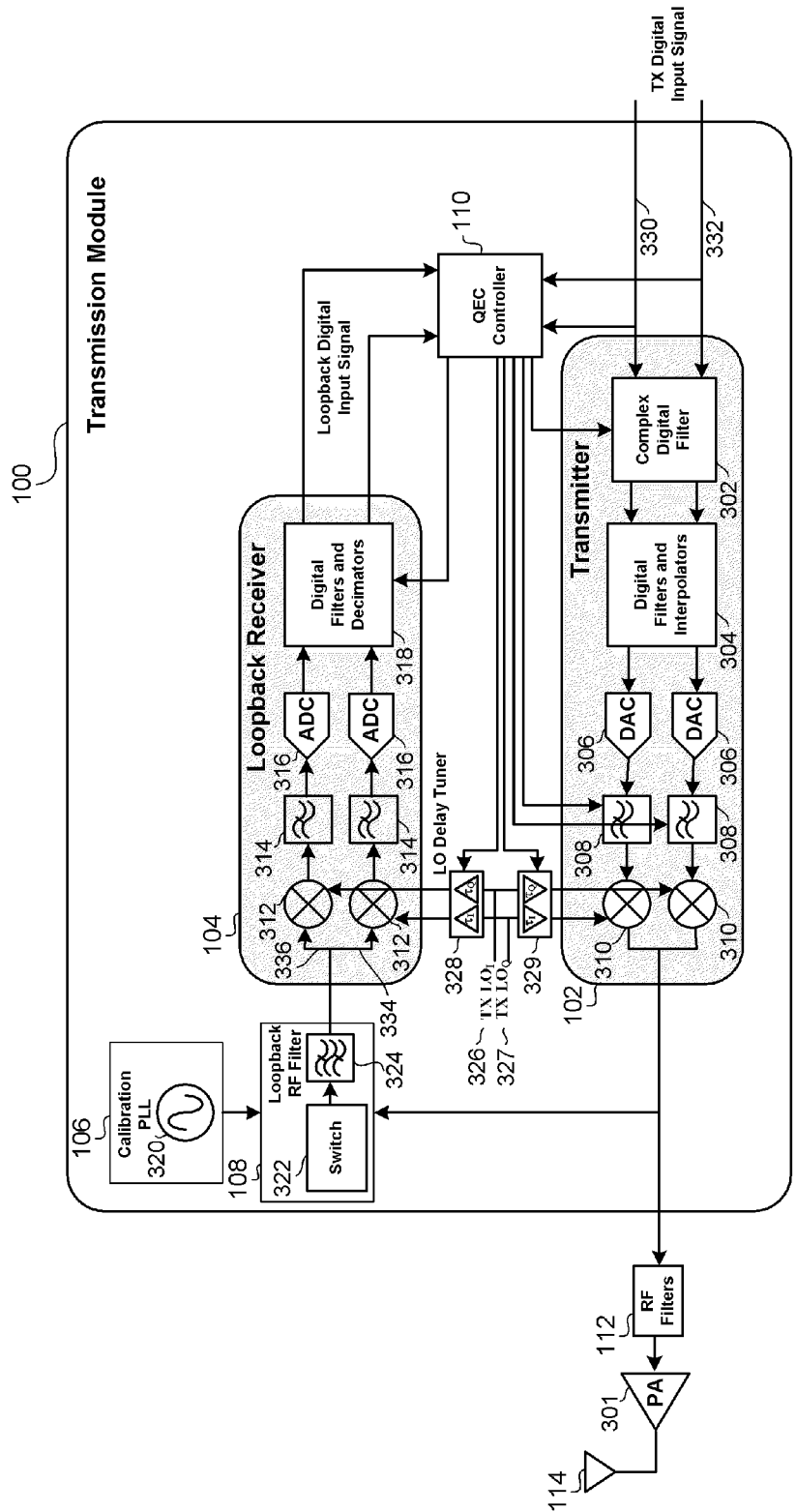
FIG. 3 is a block diagram of an embodiment of the transmission module showing one or more components of the transmitter, loopback receiver, calibration module, and switching module.

FIG. 3 is a block diagram of an embodiment of the transmission module 100 showing one or more components of the transmitter 102, loopback receiver 104, calibration module 106, and switching module 108. In addition, FIG. 3 illustrates various outputs of the QEC controller 110 that can be used to adjust the characteristics of the loopback receiver 104 and the transmitter 102. Furthermore, FIG. 3 illustrates a power amplifier 301 that can be used in conjunction with the RF filter 112 and antenna 114 for transmitting the data signals wirelessly.

The calibration module 106 can output a predetermined signal, or training signal, that can be used to calibrate the loopback receiver 104. In some embodiments, the predetermined signal can be a single sideband or double sideband signal. In the illustrated embodiment, the calibration module 106 includes a calibration phase locked-loop (PLL) 320 that generates the predetermined signal. The calibration PLL 320 can vary the frequency of the predetermined signal across the transmit band to allow the QEC controller 110 to correct the quadrature imbalance of the loopback receiver 104 across the transmit band.

In some embodiments, the calibration module 106 can include an auxiliary transmitter to generate the training signal. In some embodiments the auxiliary transmitter can be implemented as a single sideband transmitter. Prior to outputting the training signal, the auxiliary transmitter can be calibrated to remove quadrature error. In certain embodiments, the auxiliary transmitter is calibrated using a numerical control oscillator (NCO). For example, the NCO can output a sine-wave at a frequency (Ftest). The output of the auxiliary transmitter output can then be squared. Using a single-tap complex filter in the auxiliary transmitter single path, the quadrature error of the auxiliary transmitter can be calibrated by nulling the signal measured out of the squarer at 2*Ftest. In certain embodiments the auxiliary transmitter can be implemented using a double side band transmitter.

In the illustrated embodiment, the switching module 108 includes switches 322 and a loopback filter 324. However, it will be understood that other embodiments of the switching module 108 can be used. For example, in some embodiments, the switching module 108 can include the switches 322 but not include the loopback filter 324, or vice versa. The switches 322 can be implemented using one or more buffers and/or transistors.

In some embodiments, the loopback filter 324 can be used in conjunction with the complex digital filter 302 to correct baseband frequency independent quadrature imbalance in the transmitter 102. For example, the loopback filter 324 can be used to filter undesired harmonics in the output signal of the transmitter 102 that would otherwise be detected by the loopback receiver 104, and which can corrupt the measurement of quadrature error around the LO frequency of the output signal of the transmitter 102. In certain embodiments, the transmitter 102 includes mixer 310 for upconversion, and the output signal of the transmitter 102 includes signals around the LO frequency, as well as at higher order harmonics of the LO frequency. The signals at higher LO harmonics of the output signal of the transmitter 102 are downconverted by the mixers 312 of the loopback receiver 104 and can corrupt the measurement of the quadrature error around the LO frequency in the output signal of the transmitter 102. The loopback filter 324 can be used to filter the higher order harmonics in the output signal of the transmitter 102 that would otherwise be detected by the loopback receiver 104. In this way, the transmission module 100 can avoid corruption of the fundamental output signal due to the higher order harmonics. In certain embodiments, a filter located off chip can be used to filter the undesired harmonics. Once the loopback filter 324 removes the higher order harmonics, the complex digital filter 302 can be adjusted to correct the phase error.

In some embodiments, as will be described in greater detail below, the LO delay tuners 328, 329 can be used to reduce the corruption of the measurement of the quadrature error around the LO frequency in the output signal of the transmitter 102. By correcting the LO phase delay of the transmitter 102 and receiver 104, the LO phase error of the transmitter 102 and receiver 104 can be corrected at all harmonics of the LO frequency. In this way, the transmission module 100 can avoid corruption of the fundamental output signal due to the higher order harmonics.

In the illustrated embodiment, the loopback receiver 104 includes mixers 312, baseband filters 314, ADCs 316, digital filter, complex digital filter 318, and a local oscillator delay tuner 328. Furthermore, FIG. 3 illustrates an in-phase path 334 and a quadrature-phase path 336 in the loopback receiver 104.

To process the data signals, the loopback receiver 104 splits the received data signals into the in-phase signals and quadrature signals. The in-phase data signals follow the in-phase path 334, while quadrature data signals follow the quadrature-phase path 336. Once split, the loopback receiver 104 separately demodulates the in-phase signals and the quadrature signals with their respective local oscillators 326, 327 using mixers 312. In addition, the loopback receiver 104 converts the analog data signals to digital data signals using the ADCs 316 and filters the digital data signals before sending them to the QEC controller 110.

As mentioned previously, the various components of the loopback receiver 104 can introduce quadrature error into the data signals. To remove, or compensate for, the quadrature imbalance in the components of the loopback receiver 104, the transmission module 100 can use a calibration mode. During the calibration mode, the loopback receiver 104 processes the data signals received from the calibration module 106. The QEC controller 110 compares the output of the loopback receiver 104 with an expected output to identify the quadrature imbalance and the component(s) causing the quadrature imbalance. After the sources of imbalance have been identified, the QEC controller 110 adjusts the LO delay tuner 328 and/or the digital filters and decimators 318 to correct the quadrature imbalance.

The transmitter 102, in the illustrated embodiment, includes a complex digital filter 302, digital filters and interpolators 304, DACs 306, baseband filters 308, and mixers 310. Furthermore, FIG. 3 illustrates an in-phase path 330 and a quadrature-phase path 332 in the transmitter 102. It will be understood that although the in-phase path 330 and a quadrature-phase path 332 are illustrated as a single line, the paths can include multiple lines for differential signaling. For example, the paths following the DACs 306 can be differential analog signals. The in-phase data signals follow the in-phase path 330, while quadrature-phase data signals follow the quadrature-phase path 332. To process the data signals, the transmitter 102 filters the digital in-phase and quadrature-phase signals using the complex digital filter 302 and digital filters and interpolators 304. In addition, the transmitter converts the digital data signals to analog data signals using the DACs 306. After the in-phase and quadrature-phase data signals are converted to analog data signals and filtered using baseband filters 308, they are modulated with their respective local oscillator phase 326, 327 using mixers 310, and then combined for transmission. In some embodiments, the mixers 310 in the transmitter 102 and/or the mixers 312 in the loopback receiver 104 can be implemented as harmonic-rejection mixers which can reject the undesired harmonic signals described above. In such embodiments, the transmission module 100 can be implemented without the loopback filter 324.

As mentioned previously, the in-phase path LO and the quadrature-phase path LO signals are configured to be 90 degrees out of phase, which allows the in-phase data signals and the quadrature data signals to be combined without interfering with one another. However, quadrature imbalance in the local oscillators 326, 327, filters 302, 304, 308, and/or DACs can introduce quadrature errors in the form of amplitude error (e.g., mismatching amplitudes between the in-phase path and the quadrature-path), and phase error between the in-phase path and quadrature-phase path (e.g., variance from pre-determined phase differences between the in-phase path and the quadrature-path).

Once the loopback receiver 104 is calibrated (during the calibration mode), the transmission module 100 can use the QEC mode to identify and correct quadrature imbalances in the components of the transmitter 102. Depending on the type of quadrature imbalance identified, the QEC controller 110 can correct the quadrature imbalance by adjusting the characteristics of various components of the transmitter 102. For example, in some embodiments, if the QEC controller 110 determines that the quadrature error is frequency independent with respect to the carrier frequency or LO frequency, the QEC controller 110 can adjust the characteristics of the local oscillators 326, 327 using the local oscillator delay tuner 329, as will be described in greater detail below with reference to FIG. 4. In certain embodiments, if the QEC controller 110 determines that the quadrature error is frequency independent with respect to the carrier frequency or LO frequency, the QEC controller 110 can adjust the characteristics of the complex digital filter 302. For example, the complex digital filter 302 can combine portions of the in-phase path signal with portions of the quadrature-phase path signal to correct the phase error. In some embodiments, if the QEC controller 110 determines that the quadrature error is frequency dependent with respect to the carrier frequency or LO frequency, the QEC controller 110 can adjust the characteristics of the baseband filters 308 and/or the complex digital filter 302, as will be described in greater detail below with reference to FIGS. 5A and 5B.

Figure 4:
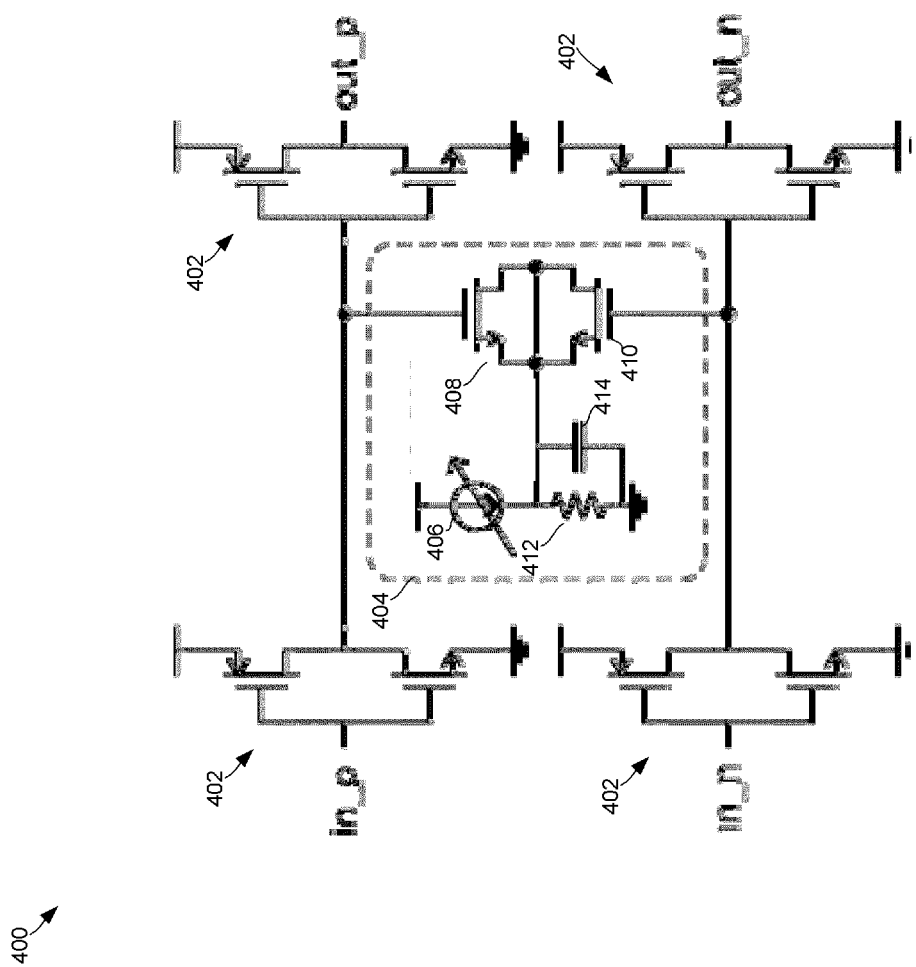
FIG. 4 is a block diagram illustrative of an embodiment of a local oscillator delay tuner for the in-phase path of the transmitter and/or the loopback receiver.

FIG. 4 is a block diagram illustrative of an embodiment of a differential signal local oscillator delay tuner 400, or local oscillator circuit, for the in-phase or quadrature-phase LO path of the transmitter 102 and/or the loopback receiver 104. The local oscillator delay tuner 400 can be used to vary the delay of the local oscillators 326, 327 with respect to one another. For example, when the QEC controller 110 determines that the quadrature error is due to local oscillator phase error, the QEC controller 110 can adjust the delay of the local oscillators with respect to one another using the local oscillator delay tuner 400. In some embodiments, the QEC controller adjusts the delay of the local oscillators by adjusting the capacitance of one or more variable capacitors. However, it will be understood that other configurations can be used to vary the local oscillator delay, such as by using variable resistors, current starved inverters with a variable bias current and/or using a resistor-capacitor (RC) lowpass filter with a variable capacitor or variable resistor. Furthermore, although illustrated as being implemented using differential signaling, it will be understood that the local oscillator delay tuner 400 can be implemented for single-ended signaling as well.

In the illustrated embodiment, the local oscillator delay tuner 400 includes inverters 402 and a variable capacitor 404. The inverters 402 can be implemented using transistors or other electronic components. For example, in the illustrated embodiment, NMOS and PMOS transistors are used to implement the transistors. However, it will be understood that the inverters can be implemented using a variety of configurations and electronic components. In addition, while the terms "metal" and "oxide" are present in the name of a MOS device, it will be understood that these transistors can have gates made out of materials other than metals, such as polycrystalline silicon, and can have dielectric "oxide" regions made from dielectrics other than silicon di-oxide, such as from silicon nitride or high-k dielectrics.

The variable capacitor 404 can be implemented using a variety of configurations. For example, the variable capacitor 404 can be implemented using voltage controlled varactors, variable current sources, variable voltage sources, digitally controlled capacitance DACs, including parallel capacitors that can be switched into and out of the circuit, etc. In the illustrated embodiment, the variable capacitor 404 is implemented using a variable current source 406, transistors 408, 410, a resistor 412, and a capacitor 414.

The output of the variable current source 406 can be coupled with the source and drain of the transistors, one end of the resistor 412, and one end of the capacitor 414. In this manner, varying the current of the variable current source 406 can vary the capacitance of the variable capacitor 404. As mentioned previously, varying the capacitance of the variable capacitor 404 can change the amount of delay of the local oscillator delay tuners 328, 329 and can correct baseband frequency independent phase error. In some embodiments, increasing the capacitance of the variable capacitor 404 increases the delay of the local oscillator delay tuners 328, 329. In certain embodiments, decreasing the capacitance of the variable capacitor 404 decreases the delay of the local oscillator delay tuners 328, 329.

In some embodiments, to correct the phase error, the QEC controller 110 adjusts the variable capacitor 404 of the LO delay tuner in the in-phase LO path without adjusting the variable capacitor 404 of the LO delay tuner in the quadrature-phase path, or vice versa. In certain embodiments, the QEC controller 110 adjusts the variable capacitor 404 in the in-phase LO path and the quadrature-phase LO path to correct the phase error. For example, if the QEC controller 110 determines that the quadrature-phase path is delayed, it can increase the capacitance of the variable capacitor 404 in the in-phase LO path and/or decrease the capacitance of a corresponding variable capacitor 404 in the quadrature-phase path. In embodiments, where the QEC controller 110 adjusts the variable capacitors 404 in the in-phase LO path and the quadrature-phase LO path, it can adjust the variable capacitors 404 in the different paths differently. For example, if the QEC controller 110 increases the capacitance of the variable capacitor 404 in the in-phase LO path then it can decrease the capacitance of a corresponding variable capacitor 404 in the quadrature-phase path, and vice versa.

Figure 5A:
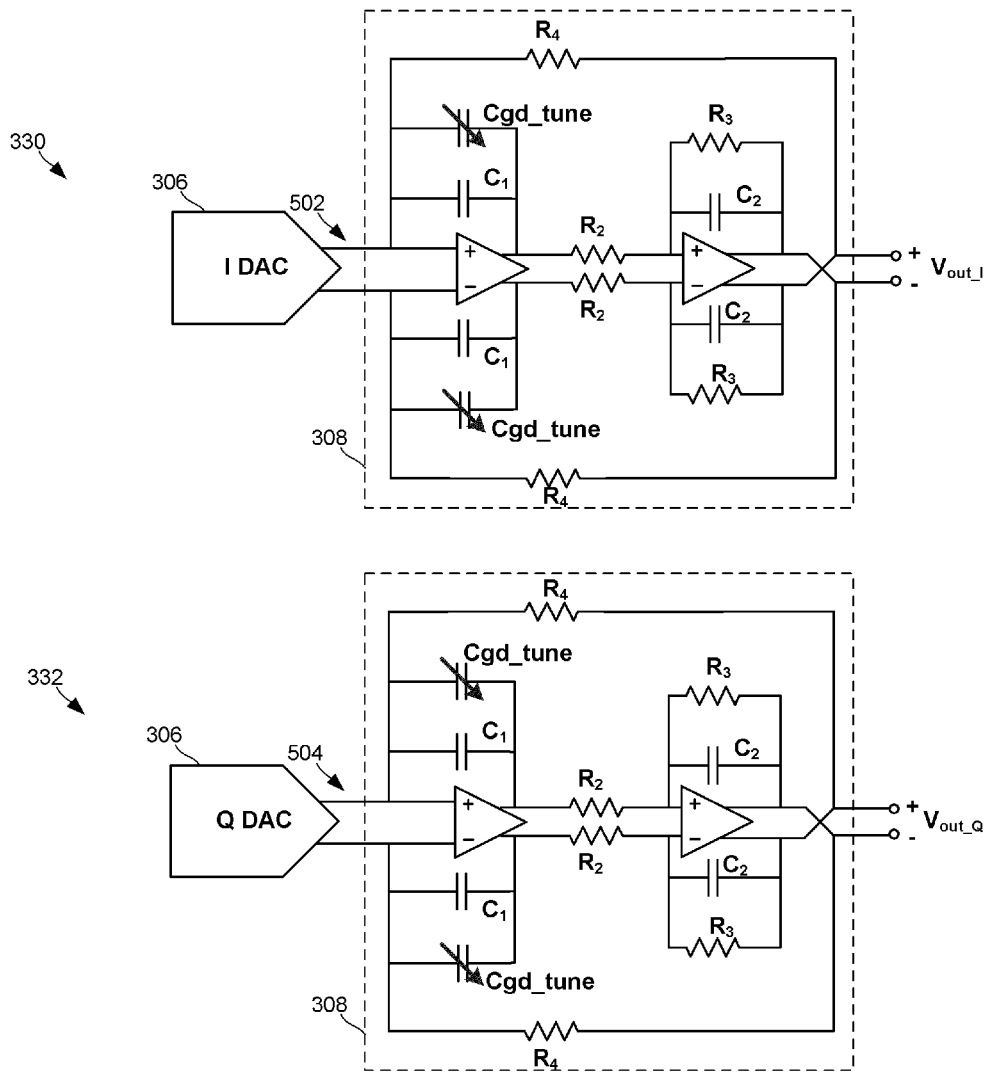
FIGS. 5A and 5B are block diagrams illustrative of embodiments of a portion of the transmitter that includes the DACs and the baseband filters with tuning circuits for correcting quadrature imbalance due to the filters.
Figure 5B:
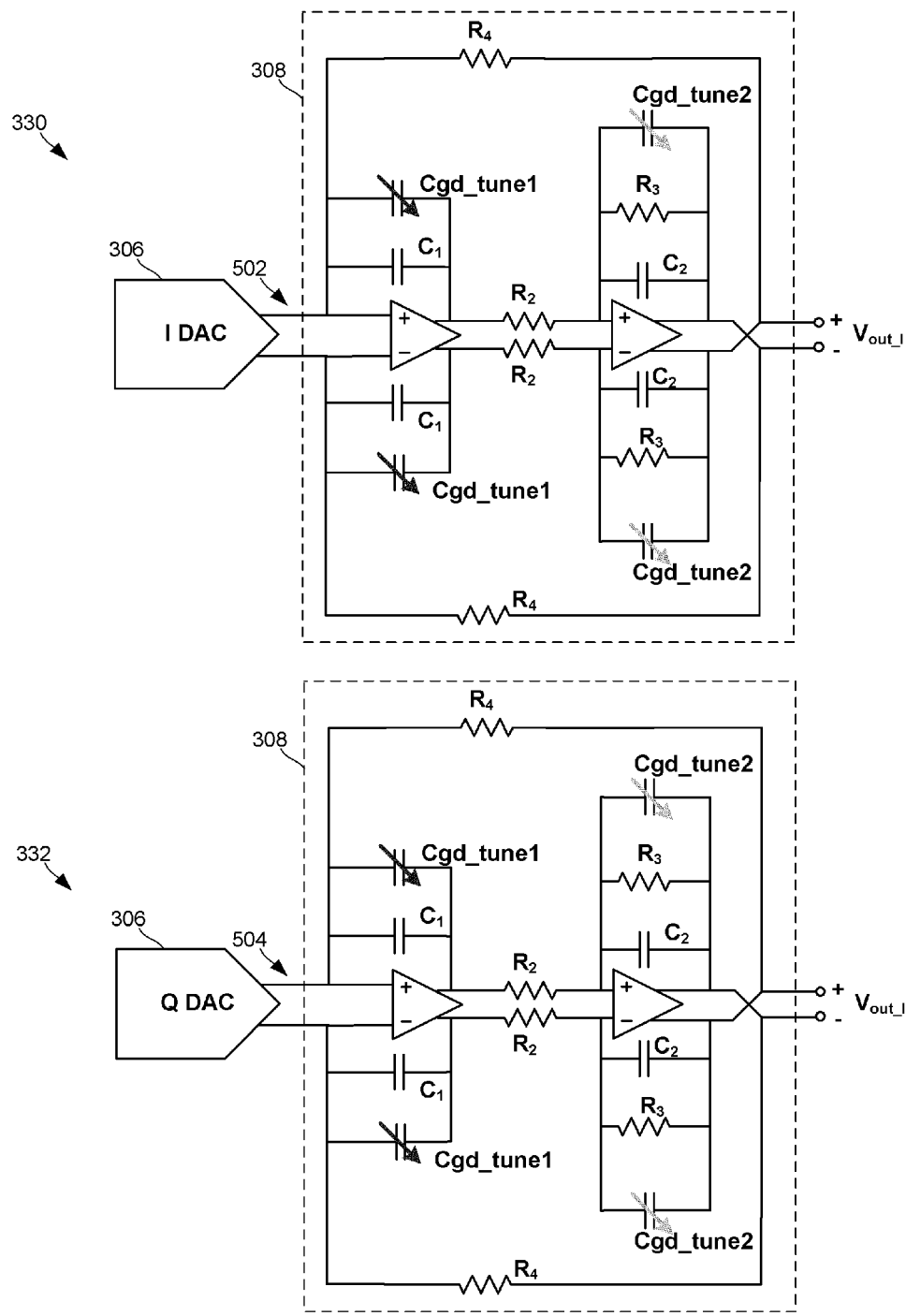

FIGS. 5A and 5B are block diagrams illustrative of embodiments of a portion of the transmitter 102 that includes the DACs 306 and the baseband filters 308 with tuning circuits for correcting quadrature imbalance due to the baseband filters 308. In the illustrated embodiments, portions of the in-phase path 330 and quadrature-phase path 332 are shown. In addition, differential analog paths 502, 504 for the in-phase and quadrature-phase paths 330, 332 are also shown.

In the illustrated embodiments, each baseband filter 308 includes one or more operational amplifiers, resistors (R2, R3, R4), and capacitors (C1, C2) configured to filter the analog signals received from the DACs 306. In some embodiments, the tuning circuit can be used to correct baseband frequency dependent phase error. The tuning circuit can be implemented using a variety of configurations. For example, the tuning circuit can be implemented using voltage controlled varactors, digitally controlled capacitance DACs, including multiple parallel capacitors that can be switched into and out of the circuit, variable capacitors, and/or variable resistors, etc. In some embodiments, components of the tuning circuit can be located in parallel with the capacitors C1 and/or C2.

In the illustrated embodiment of FIG. 5A, the tuning circuit is implemented using two variable capacitors (Cgd_tune) in parallel with capacitors C1 in the in-phase path 330 and two variable capacitors Cgd_tune in parallel with capacitors C1 in the quadrature-phase path 332. However, it will be understood that in some embodiments, the tuning circuit may only include one or more variable capacitors Cgd_tune in the in-phase path 330 and none in the quadrature-phase path 332 (or vice versa), or one or more variable capacitors Cgd_tune in both the in-phase path 330 and the quadrature-phase path 332.

In the illustrated embodiment of FIG. 5B, the tuning circuit is implemented using variable capacitors Cgd_tune1, which correspond to the variable capacitors Cgd_tune described above with reference to FIG. 5A, and variable capacitors Cgd_tune2. In the illustrated embodiment of FIG. 5B, the tuning circuit includes two variable capacitors Cgd_tune2 in parallel with capacitors C2 in the in-phase path 330 and two variable capacitors Cgd_tune2 in parallel with capacitors C2 in the quadrature-phase path 332. However, as described above with reference to the variable capacitors Cgd_tune in FIG. 5A, in some embodiments, the tuning circuit may only include one or more variable capacitors Cgd_tune2 in the in-phase path 330 and none in the quadrature-phase path 332 (or vice versa), or one or more variable capacitors Cgd_tune2 in both the in-phase path 330 and the quadrature-phase path 332. Furthermore, in some embodiments, the tuning circuit can be implemented using the variable capacitors Cgd_tune2 without the variable capacitors Cgd_tune1.

The variable capacitors (Cgd_tune, Cgd_tune1, and/or Cgd_tune2) in the tuning circuit can be used to correct phase error. For example, in some embodiments, the variable capacitors Cgd_tune and Cgd_tune1 can be used to correct first order baseband frequency dependent phase error. In certain embodiments, the variable capacitors Cgd_tune2 can be used to correct second order baseband frequency dependent phase error.

By varying the capacitance of the variable capacitors, the QEC controller 110 can adjust the baseband filter's group delay. In some embodiments, increasing the capacitance of the variable capacitors (Cgd_tune, Cgd_tune1 and/or Cgd_tune2) increases the delay of the baseband filters 308. In certain embodiments, decreasing the capacitance of the variable capacitors (Cgd_tune, Cgd_tune1 and/or Cgd_tune2) decreases the delay of the baseband filters 308. Accordingly, as the QEC controller 110 detects baseband frequency dependent phase error, it can adjust the capacitance of the variable capacitors (Cgd_tune, Cgd_tune1 and/or Cgd_tune2) to correct the phase error.

In some embodiments, the QEC controller 110 adjusts the variable capacitors (Cgd_tune, Cgd_tune1 and/or Cgd_tune2) in the in-phase path 330 without adjusting the variable capacitors (Cgd_tune, Cgd_tune1 and/or Cgd_tune2) in the quadrature-phase path 332, or vice versa. In certain embodiments, the QEC controller 110 adjusts the variable capacitors (Cgd_tune, Cgd_tune1 and/or Cgd_tune2) in the in-phase path 330 and the quadrature-phase path 332 to correct the phase error. For example, if the QEC controller 110 determines that the quadrature-phase path is delayed, it can increase the capacitance of the variable capacitors (Cgd_tune, Cgd_tune1 and/or Cgd_tune2) in the in-phase path 330 and/or decrease the capacitors (Cgd_tune, Cgd_tune1 and/or Cgd_tune2) in the quadrature-phase path 332. In embodiments, where the QEC controller 110 adjusts the variable capacitors (Cgd_tune, Cgd_tune1 and/or Cgd_tune2) in the in-phase path 330 and the quadrature-phase path 332, it can adjust the variable capacitors (Cgd_tune, Cgd_tune1 and/or Cgd_tune2) in the different paths differently. For example, if the QEC controller 110 increases the capacitance of a variable capacitor (Cgd_tune, Cgd_tune1 and/or Cgd_tune2) in the in-phase path 330 then it can decrease the capacitance of a corresponding variable capacitor (Cgd_tune, Cgd_tune1 and/or Cgd_tune2) in the quadrature-phase path 332, and vice versa.

Figure 6:
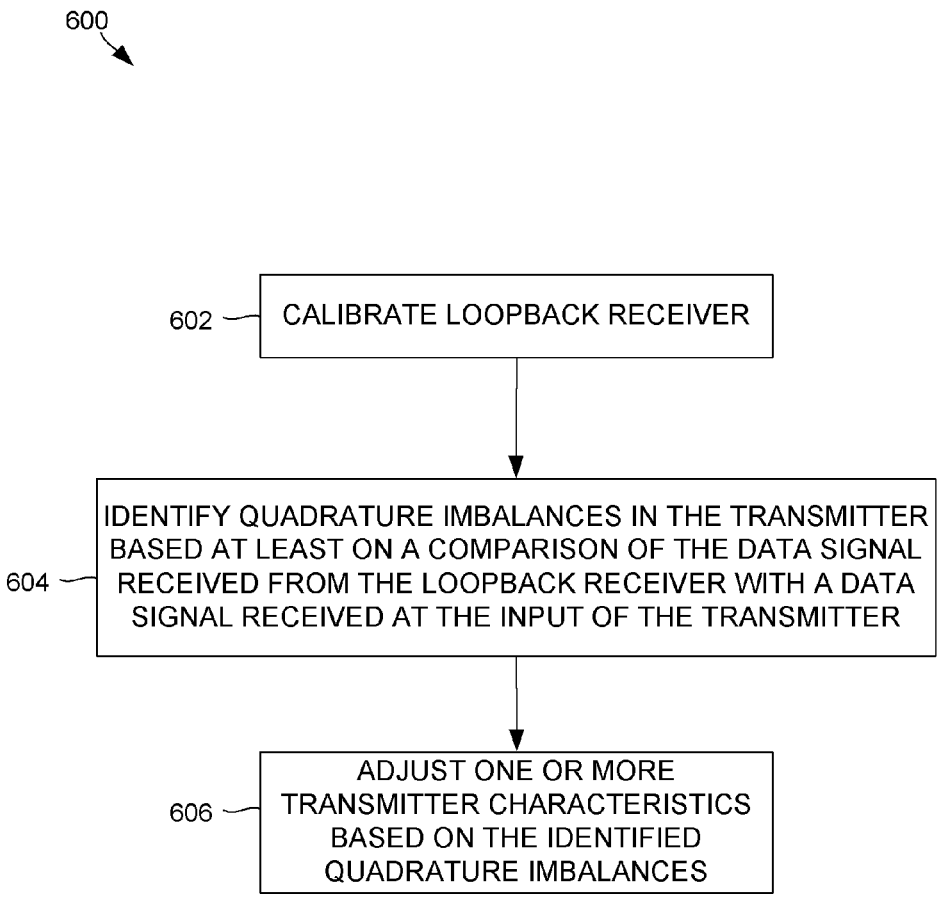
FIG. 6 is a flow diagram illustrative of a routine for correcting quadrature error in the transmitter.

FIG. 6 is a flow diagram illustrative of a routine 600 for correcting quadrature error in the transmitter 102. While specific steps of the example routine 600 provided below are described as being performed by a particular component of the transmission module 100, the steps of the routine 600 can generally be implemented by other components in other embodiments, such as any one, or any combination, of the QEC controller 110, the transmitter 102, and/or the loopback receiver 104, and can be implemented by hardware, by software/firmware, or by a combination of hardware and software/firmware. In one embodiment, instructions for the routine 600 are stored in a tangible non-transitory computer-readable medium and are executed by a processor.

At block 602, the QEC controller 110 calibrates the loopback receiver 104. As discussed in greater detail above, to calibrate the loopback receiver 104, the loopback receiver 104 can receive and process data signals from the calibration module 106. The QEC controller 110 can compare the processed data signals output by the loopback receiver 104 with an expected output. Based on the comparison, the QEC controller 110 can adjust one or more characteristics of the loopback receiver 104. For example, the QEC controller 110 can adjust the as local oscillator delay and/or filter delay. The QEC controller 110 can continue to adjust the characteristics of the loopback receiver 104 until the output of the loopback receiver 104 matches the expected output and/or the output of the loopback receiver 104 is within a threshold variance of the expected output. In other words, the QEC controller 110 can continue adjusting the characteristics of the loopback receiver until the quadrature imbalance of the loopback receiver is corrected.

At block 604, the QEC controller 110 identifies quadrature imbalances in the transmitter based at least on a comparison of a data signal received from the loopback receiver with a data signal received at the input of the transmitter. Following the calibration of the loopback receiver 104, a switching module 108 can direct data signals received from the output of the transmitter 102 to the loopback receiver 104. The loopback receiver 104 can process the data signals and send them to the QEC controller 110. The QEC controller 110 can compare the received data signals from the loopback receiver 104 to data signals received at the input of the transmitter 102. In some embodiments, the data signals received at the input of the transmitter 102 are buffered such that the signals received from the loopback receiver 104 correspond to the data signals received at the input of the transmitter 102. If the signals match, the QEC controller 110 can determine that there is little or no quadrature imbalance in the transmitter 102. However, in many instances, the signals will not match due to the quadrature imbalance in the transmitter 102.

At block 606, the QEC controller 110 adjusts characteristics of the transmitter 102 based on the comparison. As mentioned previously, the components of the transmitter 102 can introduce quadrature errors into the data signals, which can differ depending on the source of the quadrature imbalance. For example, if the source of the imbalance is the baseband filters 308, the quadrature error can be baseband frequency dependent phase error. If the source of the imbalance is the local oscillators, the quadrature error can be baseband frequency independent phase error. Accordingly, the QEC controller 110 can identify the type of quadrature error (e.g., baseband frequency dependent phase error or baseband frequency independent phase error) and adjust the characteristics of the transmitter 102 depending on the error. In some embodiments, to correct the baseband frequency dependent phase errors, the QEC controller 110 adjusts the baseband group delay in the baseband filter 308. In certain embodiments, to correct the baseband frequency independent phase errors, the QEC controller adjusts the local oscillator delay.

Fewer, more, or different blocks, or any combination thereof, can be used to implement the routine 600. For example, in some embodiments, the routine 600 can include individual blocks for the various portions of the loopback receiver calibration process.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially.

A skilled artisan will appreciate that the configurations and principles of the embodiments can be adapted for any electronic system. The circuits employing the above described configurations can be implemented into various electronic devices or integrated circuits. Examples of the electronic devices can include, but are not limited to, consumer electronic products, parts of the consumer electronic products, electronic test equipment, etc. Further, the electronic device can include unfinished products. Furthermore, the various topologies, configurations and embodiments described above may be implemented discretely or integrated on a chip without departing from the spirit and scope of the description. For example, the various components of the transmission module 100 (e.g., transmitter 102, loop-back receiver 104, calibration module 106, switching module 108, and QEC controller 110) can be implemented on a single chip or on different chips.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Embodiments are also described above with reference to flow chart illustrations and/or block diagrams of methods, and apparatus (systems). Each block of the flow chart illustrations and/or block diagrams, and combinations of blocks in the flow chart illustrations and/or block diagrams, may be implemented by computer program instructions stored in a tangible non-transitory computer-readable medium. Such instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flow chart and/or block diagram block or blocks.

These computer program instructions may also be stored in a computer-readable memory that can direct a computer or other programmable data processing apparatus to operate in a particular manner, such that the instructions stored in the computer-readable memory produce an article of manufacture including instruction means which implement the acts specified in the flow chart and/or block diagram block or blocks. The computer program instructions may also be loaded onto a computer or other programmable data processing apparatus to cause a series of operations to be performed on the computer or other programmable apparatus to produce a computer implemented process such that the instructions which execute on the computer or other programmable apparatus provide steps for implementing the acts specified in the flow chart and/or block diagram block or blocks.

Although this disclosure has been described in terms of certain embodiments, other embodiments that are apparent to those of ordinary skill in the art, including embodiments that do not provide all of the features and advantages set forth herein, are also within the scope of the disclosure. Moreover, the various embodiments described above can be combined to provide further embodiments. In addition, certain features shown in the context of one embodiment can be incorporated into other embodiments as well. Accordingly, the scope of the disclosure is defined only by reference to the appended claims.

What is claimed is:

1. A transmission system comprising:
    a switch circuit;
    a transmitter communicatively coupled to the switch circuit;
    a loopback receiver communicatively coupled to the switch circuit;
    a calibration circuit communicatively coupled to the switch circuit and configured to output a training data signal; and
    a controller communicatively coupled to the loopback receiver and the transmitter, wherein in a first state, the switch circuit is configured to provide a first communication pathway between an output of the calibration circuit and an input of the loopback receiver such that the loopback receiver receives the training data signal and the switch circuit does not provide a second communication pathway between the output of the transmitter and the input of the loopback receiver, and the controller is configured to identify and correct quadrature imbalance in the loopback receiver based at least on a comparison of the output of the loopback receiver with an expected output, wherein in a second state, the switch circuit is configured to provide the second communication pathway between the output of the transmitter and the input of the loopback receiver such that the loopback receiver receives a transmitter-processed data signal and the switch circuit does not provide the first communication pathway between the output of the calibration circuit and the input of the loopback receiver, wherein the transmitter-processed data signal is transmitted by the transmitter, and the controller is configured to:

identify quadrature imbalance in the transmitter based at least in part on a comparison of a loopback receiver-processed data signal received from the loopback receiver with a buffered data signal that corresponds to the transmitter-processed data signal prior to being processed and transmitted by the transmitter, wherein the loopback receiver-processed data signal and the buffered data signal each comprise an in-phase data signal and a quadrature data signal, and adjust one or more characteristics of the transmitter to correct the identified quadrature imbalance present in the transmitter based at least in part on the comparison.

2. A transmission system comprising:
a transmitter;
a loopback receiver; and
a controller configured to:
in a first mode, calibrate the loopback receiver to account for quadrature imbalance in the loopback receiver, wherein in the first mode, a switch circuit provides a first communication pathway between an output of a calibration circuit and an input of the loopback receiver such that the loopback receiver receives a training data signal and the switch circuit does not provide a second communication pathway between an output of the transmitter and the input of the loopback receiver, and in a second mode:
receive a loopback receiver-processed data signal from the calibrated loopback receiver that corresponds to a transmitter-processed data signal that is processed by the receiver,
identify quadrature imbalance in the transmitter based at least in part on a comparison of the loopback receiver-processed data signal received from the calibrated loopback receiver with a buffered data signal that corresponds to the transmitter-processed data signal prior to being processed by the transmitter, wherein the loopback receiver-processed data signal and the buffered data signal each comprise an in-phase data signal and a quadrature data signal, and
adjust at least one of one or more filters or one or more long oscillation delays of the transmitter to correct the identified quadrature imbalance based at least in part on the comparison, wherein in the second mode, the switch circuit provides a second communication pathway between an output of the transmitter and the input of the loopback receiver such that the loopback receiver receives a transmitter-processed data signal and the switch circuit does not provide the first communication pathway between the output of the calibration circuit and the input of the loopback receiver.

3. The transmission system of claim 2, wherein the switch circuit comprises:
at least one of a first buffer and a first switch in a signal path between the output of the calibration circuit and the input of the loopback receiver; and
at least one of a second buffer and a second switch in a signal path between the output of the transmitter and the input of the loopback receiver.

4. The transmission system of claim 3, wherein the switch circuit further comprises a loopback filter configured to filter higher-order harmonic signals in the transmitter-processed data signals.

5. The transmission system of claim 2, wherein the controller is configured to:
identify the quadrature imbalance present in the loopback receiver based at least in part on a comparison of a training data signal processed by the loopback receiver with an expected output data signal, and
adjust one or more characteristics of the loopback receiver based at least in part on the identified quadrature imbalance.

6. The transmission system of claim 5, wherein the controller is further configured to adjust at least one of a local oscillator delay of the loopback receiver and one or more filters of the loopback receiver to adjust one or more characteristics of the loopback receiver.

7. The transmission system of claim 2, wherein the quadrature imbalance in the transmitter comprises phase error and amplitude error.

8. The transmission system of claim 7, wherein the phase error comprises baseband frequency independent phase error and baseband frequency dependent phase error.

9. The transmission system of claim 8, wherein to correct the baseband frequency independent phase error, the controller is configured to adjust at least one of a complex digital filter and a local oscillator delay in a local oscillator circuit.

10. The transmission system of claim 9, wherein to adjust the local oscillator delay, the controller is further configured to adjust at least one of a variable capacitor, a variable resistor, and a current starved inverter.

11. The transmission system of claim 8, wherein to correct baseband frequency dependent phase error, the controller is configured to adjust at least one of a complex digital filter and a baseband filter delay.

12. The transmission system of claim 11, wherein to adjust a baseband filter delay the controller is configured to adjust at least one of a variable capacitor, a variable resistor, a digital filter, and a voltage controlled varactor.

13. An electronically-implemented method for quadrature error correction comprising:
in a first mode, calibrating a loopback receiver to account for quadrature imbalance in the loopback receiver, wherein in the first mode, a switch circuit provides a first communication pathway between an output of a calibration circuit and an input of a loopback receiver such that the loopback receiver receives a training data signal and the switch circuit does not provide a second communication pathway between an output of a transmitter and the input of the loopback receiver; and in a second mode:

receiving, from the calibrated loopback receiver, a loopback receiver-processed data signal that corresponds to a transmitter-processed data signal that has been processed by the calibrated loopback receiver;

identifying quadrature imbalance in the transmitter based at least in part on a comparison of the loopback receiver-processed data signal received from the calibrated loopback receiver with a buffered data signal that corresponds to the transmitter-processed data signal prior to being processed by the transmitter, wherein the loopback receiver-processed data signal and the buffered data signal each comprise an in-phase data signal and a quadrature data signal; and adjusting one or more characteristics of the transmitter to correct the identified quadrature imbalance based at least in part on the comparison, wherein in the second mode, the switch circuit provides a second communication pathway between the output of the transmitter and the input of the loopback receiver such that the loopback receiver receives a transmitter-processed data signal and the switch circuit does not provide the first communication pathway between the output of the calibration circuit and the input of the loopback receiver.

14. The method of claim 13, wherein adjusting one or more characteristics of the loopback receiver comprises adjusting at least one of a local oscillator delay of the loopback receiver and one or more filters of the loopback receiver.

15. The method of claim 14, wherein the quadrature imbalance in the transmitter comprises phase error and amplitude error.

16. The method of claim 15, wherein the phase error comprises baseband frequency independent phase error and baseband frequency dependent phase error.

17. The method of claim 16, further comprising adjusting a local oscillator delay in a local oscillator circuit to correct the baseband frequency independent phase error.

18. The method of claim 16, further comprising adjusting a baseband filter delay to correct baseband frequency dependent phase error.

19. The method of claim 18, wherein adjusting the baseband filter delay comprises adjusting at least one of a variable capacitor, a variable resistor, a digital filter, and a voltage controlled varactor.

* * * * *